(12) United States Patent
Hwang et al.

(10) Patent No.: US 11,538,814 B2
(45) Date of Patent: Dec. 27, 2022

(54) STATIC RANDOM ACCESS MEMORY OF 3D STACKED DEVICES

(71) Applicant: SAMSUNG ELECTRONICS CO., LTD., Suwon-si (KR)

(72) Inventors: Inchan Hwang, Schenectady, NY (US); Hwichan Jun, Clifton Park, NY (US)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 14 days.

(21) Appl. No.: 17/239,060

(22) Filed: Apr. 23, 2021

(65) Prior Publication Data

US 2022/0246623 A1     Aug. 4, 2022

Related U.S. Application Data

(60) Provisional application No. 63/143,221, filed on Jan. 29, 2021.

(51) Int. Cl.
    *H01L 21/00*     (2006.01)
    *H01L 27/11*     (2006.01)
    (Continued)

(52) U.S. Cl.
    CPC .. *H01L 27/1104* (2013.01); *H01L 21/823828* (2013.01); *H01L 21/823871* (2013.01); *H01L 23/528* (2013.01); *H01L 27/0922* (2013.01)

(58) Field of Classification Search
    CPC ......... H01L 27/1104; H01L 21/823828; H01L 21/823871
    See application file for complete search history.

(56) References Cited

U.S. PATENT DOCUMENTS

| | | | |
|---|---|---|---|
| 9,373,386 B2 * | 6/2016 | Liaw | G11C 29/82 |
| 9,704,862 B2 * | 7/2017 | Park | H01L 27/092 |

(Continued)

FOREIGN PATENT DOCUMENTS

| | | | |
|---|---|---|---|
| DE | 102019120821 A1 * | 2/2020 | G11C 11/412 |
| EP | E P-3581543 A1 * | 12/2019 | B82Y 10/00 |

(Continued)

OTHER PUBLICATIONS

Communication dated May 6, 2022 issued by the European Patent Office in application No. 21208146.7.

(Continued)

*Primary Examiner* — Laura M Menz
(74) *Attorney, Agent, or Firm* — Sughrue Mion, PLLC

(57) ABSTRACT

A semiconductor device and a method of manufacturing the same are provided. The semiconductor device includes a static random access memory (SRAM) including a plurality of transistors disposed in a first layer and a second layer. The first layer includes a first shared gate of a first transistor and a second shared gate of a second transistor, among the plurality of transistors. The second layer is disposed above the first layer and includes a third shared gate of a third transistor and a fourth shared gate of a fourth transistor, among the plurality of transistors. The third shared gate is disposed above the first shared gate, and the fourth shared gate is disposed above the second shared gate. The SRAM further includes a first shared contact, a second shared contact, a first cross-couple contact connecting the fourth shared gate and the first shared contact, and a second cross-couple contact connecting the third shared gate and the second shared contact.

20 Claims, 9 Drawing Sheets

(51) Int. Cl.
    *H01L 21/8238*     (2006.01)
    *H01L 23/528*     (2006.01)
    *H01L 27/092*     (2006.01)

(56) References Cited

U.S. PATENT DOCUMENTS

| | | | |
|---|---|---|---|
| 9,997,598 | B2 | 6/2018 | Smith et al. |
| 10,170,485 | B2 | 1/2019 | Guillorn et al. |
| 10,242,984 | B2 * | 3/2019 | Park .................. H01L 27/092 |
| 10,483,166 | B1 | 11/2019 | Cheng et al. |
| 10,593,681 | B1 | 3/2020 | Rubin |
| 10,756,096 | B2 | 8/2020 | Paul et al. |
| 10,818,674 | B2 | 10/2020 | Mann et al. |
| 10,840,146 | B1 | 11/2020 | Paul et al. |
| 11,107,822 | B2 * | 8/2021 | Yang .................. H01L 27/0207 |
| 11,244,949 | B2 * | 2/2022 | Weckx ................ G11C 11/412 |
| 11,335,673 | B2 * | 5/2022 | Do ...................... H01L 27/092 |
| 11,349,001 | B2 * | 5/2022 | Xie .................... H01L 29/66515 |
| 11,367,479 | B2 * | 6/2022 | Yang .................. H01L 21/475 |
| 2006/0220134 | A1 | 10/2006 | Huo et al. |
| 2008/0023728 | A1 | 1/2008 | Jang et al. |
| 2008/0303100 | A1 * | 12/2008 | Narita ............. H01L 21/823871<br>257/369 |
| 2011/0266623 | A1 | 11/2011 | Han et al. |
| 2013/0141963 | A1 * | 6/2013 | Liaw .................. H01L 27/1211<br>257/369 |
| 2014/0035056 | A1 | 2/2014 | Liaw |
| 2015/0194205 | A1 * | 7/2015 | Liaw .................... G11C 11/413<br>365/154 |
| 2017/0317065 | A1 * | 11/2017 | Hirose ................ G11C 11/418 |
| 2019/0386011 | A1 * | 12/2019 | Weckx ................ H01L 21/8221 |
| 2020/0058564 | A1 * | 2/2020 | Hsu .................. H01L 21/823828 |
| 2020/0219970 | A1 | 7/2020 | Mannebach et al. |
| 2020/0381300 | A1 | 12/2020 | Zhang et al. |
| 2021/0020644 | A1 * | 1/2021 | Paul .................. H01L 21/02532 |
| 2021/0057023 | A1 * | 2/2021 | Liaw ................ H01L 29/78696 |
| 2021/0098049 | A1 * | 4/2021 | Yang .................... H01L 21/475 |
| 2021/0111028 | A1 * | 4/2021 | Xie .................... H01L 29/41775 |
| 2022/0181331 | A1 * | 6/2022 | Chhabra ............. H01L 27/0922 |
| 2022/0246610 | A1 * | 8/2022 | Song .................. H01L 27/092 |
| 2022/0246623 | A1 * | 8/2022 | Hwang ............. H01L 27/0207 |
| 2022/0246739 | A1 * | 8/2022 | Xie .................... H01L 29/41791 |

FOREIGN PATENT DOCUMENTS

| | | | | |
|---|---|---|---|---|
| EP | | 3581543 B1 * | 4/2022 | ............. B82Y 10/00 |
| EP | | 4036973 A2 * | 8/2022 | ..... H01L 21/823828 |
| WO | WO-2016117288 A1 * | | 7/2016 | ........... G11C 11/418 |
| WO | WO-2020255801 A1 * | | 12/2020 | .......... H01L 27/1108 |

OTHER PUBLICATIONS

Communication dated Aug. 17, 2022, issued by the European Patent Office in counterpart European Application No. 21208146.7.

* cited by examiner

- Si substrate and active regions
- Dielectric to isolate two active regions
- Dielectric for isolate with substrate
- Metal gate1
- Metal gate2
- Dielectric cutting metal gate
- Dielectric filled after metal gate recess
- Dielectric for metal gate capping
- Cross couple contact
- Contact on metal gate(WL)

STATIC RANDOM ACCESS MEMORY OF 3D STACKED DEVICES

CROSS-REFERENCE TO RELATED APPLICATION

This application is based on and claims priority to U.S. Provisional Application No. 63/143,221 filed on Jan. 29, 2021, in the United States Patent and Trademark Office, the disclosure of which is incorporated by reference herein in its entirety.

BACKGROUND

1. Field

One or more embodiments of the disclosure relate to a semiconductor device, and more particularly, to a static random access memory (SRAM) cell in a 3D stacked device.

2. Description of the Related Art

The size of transistors continues to shrink in order to sustain scaled down logic circuits in electronic devices. However, as the continuous reduction in the size of transistors faces physical limits, planar-structured transistors have evolved into gate all-around structures, such as FinFET and MBCFET, in order to concentrate more transistors in a certain area size and to place more control over a channel and a gate of a transistor. Because the technology to reduce the size of a single transistor has its limits, there has been an ongoing research into a three-dimensional form in which transistors are vertically stacked into a 3D structure to provide higher density in transistor integration.

A static random access memory (SRAM) is a type of random access memory made up of transistors, and is one of the most essential elements in a cache memory. As such, there has been an ongoing research on circuitry and physical structure of SRAM to tightly optimize areal density and performance. Generally, an SRAM circuit consists of two (2) n-type metal-oxide semiconductor (NMOS) transistors and two (2) p-type metal oxide semiconductor (PMOS) transistors for two inverters, and two NMOS transistors for pass-gate transistors on a single plane. However, the planar-structured SRAM require more space to fit in transistors (e.g., four NMOS transistors and two PMOS transistors), thereby increasing the size of a chip.

Therefore, one or more layouts for a 3D stacked SRAM device including an active cross-coupled contact are provided to optimize areal density and performance of SRAM.

SUMMARY

According to one or more embodiments, there is provided a semiconductor device including a static random access memory (SRAM) including a plurality of transistors disposed in a first layer and a second layer; the first layer including a first shared gate of a first transistor and a second shared gate of a second transistor, among the plurality of transistors; the second layer disposed above the first layer and including a third shared gate of a third transistor and a fourth shared gate of a fourth transistor, among the plurality of transistors, wherein the third shared gate is disposed above the first shared gate, and the fourth shared gate is disposed above the second shared gate; a first shared contact and a second shared contact; a first cross-couple contact connecting the fourth shared gate and the first shared contact; and a second cross-couple contact connecting the third shared gate and the second shared contact.

According to one or more embodiments, there is provided a method of manufacturing a static random access memory (SRAM) in a three-dimensional (3D) stack. The method includes: providing a first metal gate as a first layer; providing a second metal gate as a second layer, the second layer being disposed above the first layer; performing a gate cutting through the first metal gate and the second metal gate; removing a portion of the second metal gate to form a first recess; filling the first recess with a first dielectric material; and providing a cross-couple contact on the second metal gate and a portion of the first dielectric material.

According to one or more embodiments, there is provided a semiconductor device including: a static random access memory (SRAM) cell that includes two n-type metal oxide semiconductor (NMOS) transistors and two p-type metal oxide semiconductor (PMOS) transistors; an upper layer including the two PMOS transistors; a lower layer including the two NMOS transistors; a first shared contact and a second shared contact; a first cross-couple contact connecting a gate of a first PMOS transistor among the two PMOS transistors to the first shared contact; and a second cross-couple contact connecting a gate of a second PMOS transistor among the two PMOS transistors to the second shared contact.

BRIEF DESCRIPTION OF THE DRAWINGS

The above and other aspects, features, and advantages of certain embodiments of the disclosure will be more apparent from the following description taken in conjunction with the accompanying drawings in which.

DETAILED DESCRIPTION

Figure 1:
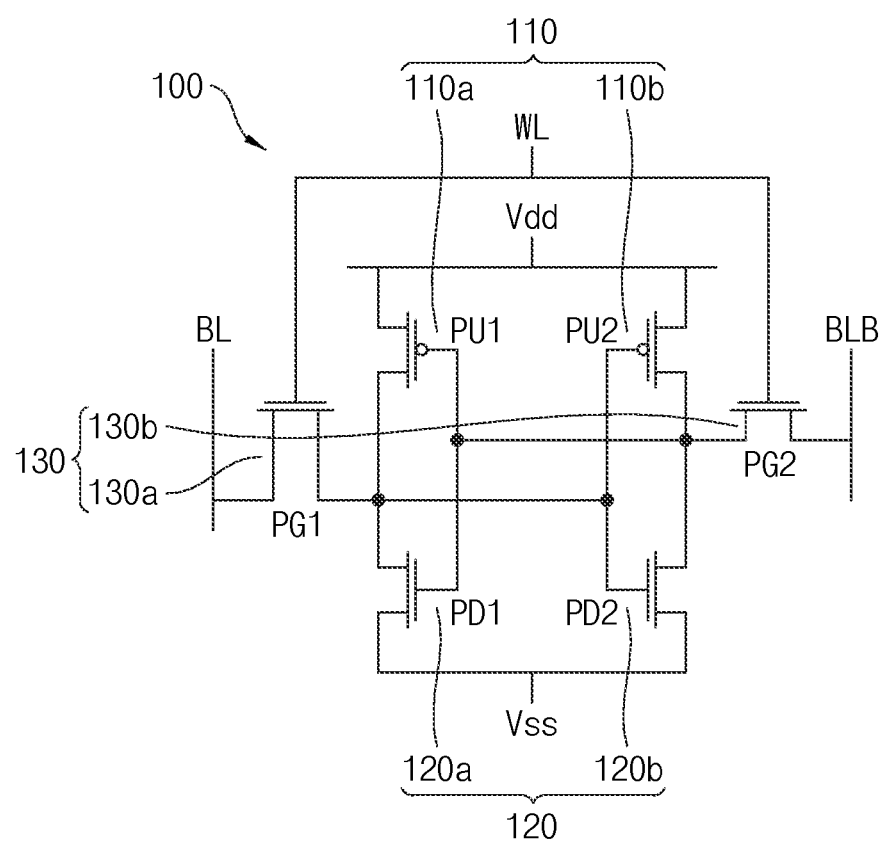
FIG. 1 is a diagram illustrating an example of an SRAM circuit.

Hereinafter, one or more embodiments will be described in detail with reference to the accompanying drawings.

The embodiments described herein are all example embodiments, and thus, the inventive concept is not limited thereto, and may be realized in various other forms. Each of the embodiments provided in the following description is not excluded from being associated with one or more features of another example or another embodiment also provided herein or not provided herein but consistent with the inventive concept. For example, even if matters described in a specific example or embodiment are not described in a different example or embodiment thereto, the matters may be understood as being related to or combined with the different example or embodiment, unless otherwise mentioned in descriptions thereof. In addition, it should be understood that all descriptions of principles, aspects, examples, and embodiments of the inventive concept are intended to encompass structural and functional equivalents thereof. In addition, these equivalents should be understood as including not only currently well-known equivalents, but also equivalents to be developed in the future, that is, all devices invented to perform the same functions regardless of the structures thereof. For example, a MOSFET described herein may take a different type or form of a transistor as long as the inventive concept can be applied thereto.

It will be understood that when an element, component, layer, pattern, structure, region, or so on (hereinafter collectively "element") of a semiconductor device is referred to as being "over," "above," "on," "below," "under," "beneath," "connected to" or "coupled to" another element the semiconductor device, it can be directly over, above, on, below, under, beneath, connected or coupled to the other element or an intervening element(s) may be present. In contrast, when an element of a semiconductor device is referred to as being "directly over," "directly above," "directly on," "directly below," "directly under," "directly beneath," "directly connected to" or "directly coupled to" another element of the semiconductor device, there are no intervening elements present. Like numerals refer to like elements throughout this disclosure.

Spatially relative terms, such as "over," "above," "on," "upper," "below," "under," "beneath," "lower," and the like, may be used herein for ease of description to describe one element's relationship to another element(s) as illustrated in the figures. It will be understood that the spatially relative terms are intended to encompass different orientations of a semiconductor device in use or operation in addition to the orientation depicted in the figures. For example, if the semiconductor device in the figures is turned over, elements described as "below" or "beneath" other elements would then be oriented "above" the other elements. Thus, the term "below" can encompass both an orientation of above and below. The semiconductor device may be otherwise oriented (rotated 90 degrees or at other orientations) and the spatially relative descriptors used herein interpreted accordingly.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. Herein, when a term "same" is used to compare a dimension of two or more elements, the term may cover a "substantially same" dimension.

It will be understood that, although the terms first, second, third, fourth etc. may be used herein to describe various elements, these elements should not be limited by these terms. These terms are only used to distinguish one element from another element. Thus, a first element discussed below could be termed a second element without departing from the teachings of the inventive concept.

It will be also understood that, even if a certain step or operation of manufacturing an inventive apparatus or structure is described later than another step or operation, the step or operation may be performed later than the other step or operation unless the other step or operation is described as being performed after the step or operation.

One or more embodiments are described herein with reference to cross-sectional illustrations that are schematic illustrations of the embodiments (and intermediate structures). As such, variations from the shapes of the illustrations as a result, for example, of manufacturing techniques and/or tolerances, are to be expected. Thus, the one or more embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept. Further, in the drawings, the sizes and relative sizes of layers and regions may be exaggerated for clarity.

For the sake of brevity, conventional elements to semiconductor devices may or may not be described in detail herein. However, even if a certain element is described or illustrated in a semiconductor device in this disclosure, the element may not be included in a claimed semiconductor device unless the element is recited as being included in the claimed semiconductor device.

FIG. 1 is a diagram illustrating an example of an SRAM circuit.

SRAM is a type of random-access memory that uses latching circuitry to store one or more bits. Referring to FIG. 1, a typical SRAM circuit 100 is made up of six metal-oxide semiconductor field effect transistors (MOSFETs)(e.g., pull-up transistors PU1 110*a* and PU2 110*b*, pull-down transistors PD1 120*a* and PD2 120*b*, and pass-gate transistors PG1 130*a* and PG2 130*b*). Each bit in an SRAM is stored on four transistors (i.e., the PU1 110*a*, the PD1 120*a*, the PU2 110*b* and the PD2 120*b*) that form two cross-coupled inverters. For example, the PU1 110*a* and PD1 120*a* may be one inverter and the PU2 110*b* and the PD2 120*b* may be the other inverter. Two pass-gate transistors (i.e., the PG1 130*a* and the PG2 130*b*) serve to control the access to a memory cell (i.e., two cross-coupled inverters) during read and write operations.

During the reading operation, a word line WL may be set to high (i.e., logic state "1") so as to activate access to the memory cell by the PG1 130*a* and the PG2 130*b*. By activating the word line WL, a value (i.e., "0" or "1") in the memory cell may be read through a bit line BL and/or a complementary bit line BLB. For example, if a logic state "1" is stored in the memory cell and when the word line WL turns on the PG1 130*a* and the PG2 130*b*, the bit line BL may read "1" and the complementary bit line BLB may read "0." During the writing operation, for example, if an instruction to write a "1" in the memory cell is to be executed, the word line WL may be set high to turn on the PG1 130*a* and the PG2 130*b*, and the bit line BL may be set to a high voltage to override the value "0" stored in the memory cell. Accordingly, one or more bits may be stored and accessed in the SRAM.

Figure 2:
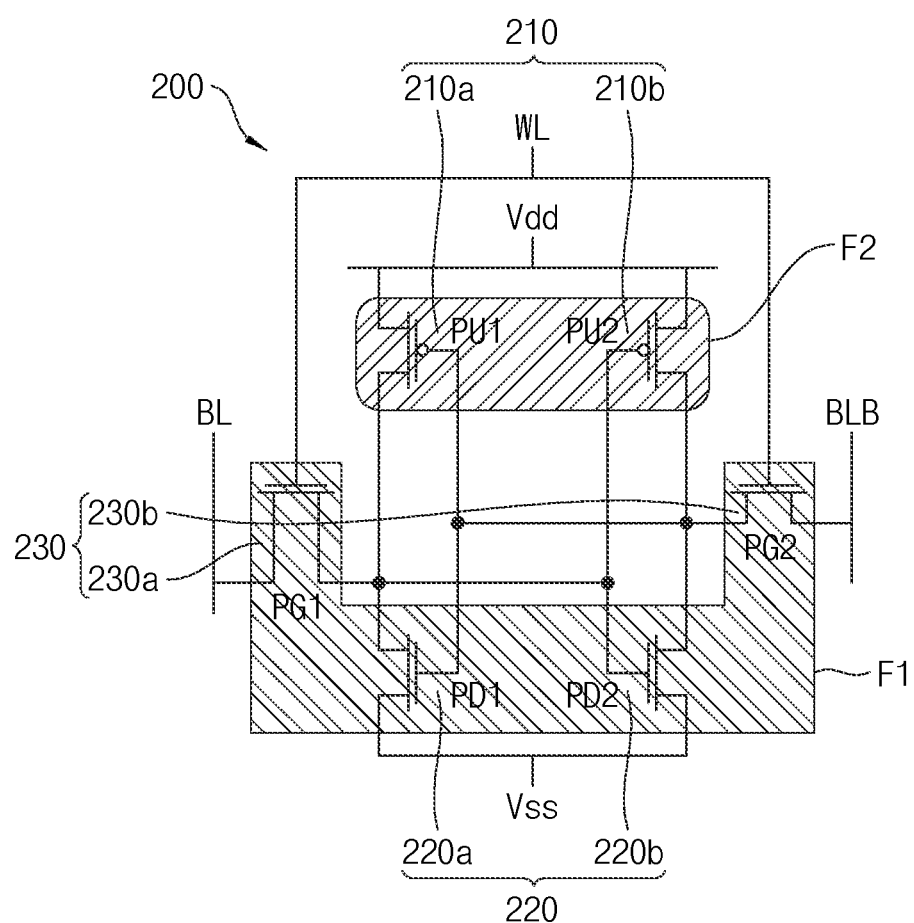
FIG. 2 is a diagram illustrating a cross-sectional view of a 3D stacked SRAM circuit according to an embodiment.

FIG. 2 is a diagram illustrating a cross-sectional view of an SRAM circuit according to an embodiment.

Referring to FIG. 2, an SRAM circuit 200 may be structured such that a first pull-down transistor PD1 220a, a second pull-down transistor PD2 220b, a first pass-gate transistor PG1 230a and a second pass-gate transistor PG2 230b are located on a first floor F1 (also referred to as "a lower floor" and/or "a first layer"), and a first pull-up transistor PU1 210a and a second pull-up transistor PU2 210b are located on a second floor F2 (also referred to as "an upper floor" and/or "a second layer"). Here, the second floor F2 is located above the first floor F1. In other words, the PU1 210a and PU2 210b transistors may be arranged above the PD1 220a, PD2 220b, PG1 230a and PG2 230b transistors. For example, the PU1 210a and the PU2 210b may be arranged directly above the PD1 220a and the PD2 220b, respectively, and each of the PG1 230a and the PG2 230b may be disposed adjacent to each side the PD1 220a and the PD2 220b. That is, for example, the PG1 230a may be disposed adjacent to the PD1 220a, and the PG2 230b may be disposed adjacent to the PD2 220b, where the pPG1 230a and the PG2 230b are disposed opposite from each other with respect to the PD1 220a and PD2 220b therebetween. However, the one or more embodiments are not limited thereto, and various arrangement of the transistors may be used.

Moreover, the PD1 220a, the PD2 220b, the PG1 230a and the PG2 230b may be n-type metal-oxide semiconductor (NMOS) transistors, and the PU1 210a and the PU2 210b may be a p-type metal-oxide semiconductor (PMOS) transistors. However, the one or more embodiments are not limited thereto, and other transistors and/or other circuit configurations may be used. In addition, as shown in FIG. 2, the PU1 210a and the PU2 210b may be connected to a voltage source Vdd, and the PD1 220a and the PD2 220b may be connected to a voltage source Vss.

According to the SRAM circuit 200 shown in FIG. 2, by placing pull-up transistors (e.g., two (2) PMOS transistors) above pull-down transistors and pass-gate transistors (e.g., four (4) NMOS transistors), the size of an area required to place all the transistors for the SRAM circuit may be reduced while maintaining the performance and functionality of the SRAM.

Figure 3:
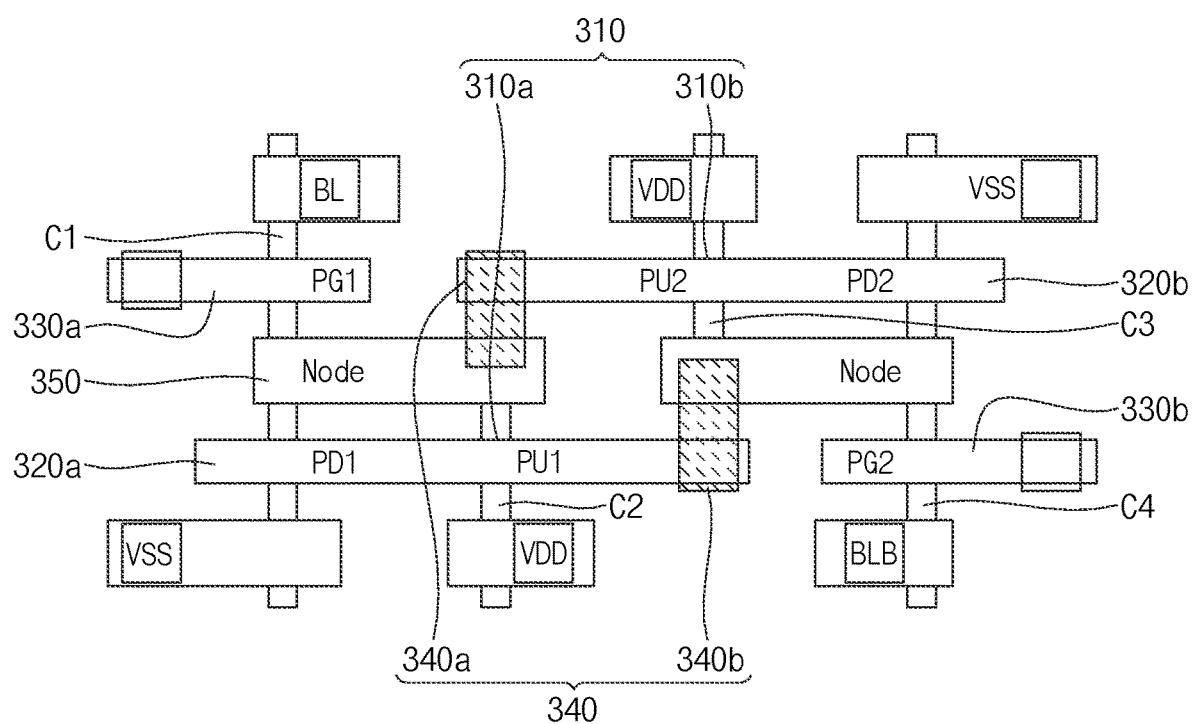
FIG. 3 is a diagram illustrating a top view of an example SRAM layout.

FIG. 3 is a diagram illustrating a top view of an example SRAM layout.

Referring to FIG. 3, an SRAM circuit may include a first pull-up transistor PU1 310a, a second pull-up transistor PU2 310b, a first pull-down transistor PD1 320a, a second pull-up transistor PD2 320b, a first pass-gate transistor PG1 330a and a second pass-gate transistor PG2 330b. Similar to the SRAM circuit 200 shown in FIG. 2, the PU1 310a and PD1 320a are connected to make up one inverter, and the PU2 310b and the PD2 320b are connected to make up another inverter. Here, each gate of the PU1 310a and the PU2 310b are connected to each gate of the PD1 320a and the PD2 320b. Each source of the PU1 310a and the PU2 310b are connected to a voltage source Vdd by contacts C2 and C3, respectively. Each drain of the PU1 310a and the PU2 310b may be connected to nodes 350. That is, a drain of the PU1 310a may be connected to one of the nodes 350 through a second cross-couple contact 340b so as to connect to a source of the PG2 330b, and a drain of the PU2 310b may be connected to the other one of the nodes 350 through a first cross-couple contact 340a so as to connect to a drain of the PG1 330a. Each gate of the PG1 330a and PG2 330b are connected to a word line, and each drain of the PG1 330a and PG2 330b are connected to respective bit lines BL and BLB through contacts C1 and C4, respectively. A source of the PG1 330a is connected to the drain of the PU1 310a, which is connected to a source of the PD1 320a. Similarly, a source of the PG2 330b is connected to the drain of the PU2 310b, which is connected to a source of the PD2 320b. The PD1 320a and PD2 320b are also connected to a voltage source Vss. Here, the PU1 310a and PU2 310b may be PMOS transistors, and the PD1 320a, the PD2 320b, the PG1 330a and the PG2 330b may be NMOS transistors.

The SRAM circuit shown in FIG. 3 may be separated into the first floor and the second floor in a 3D stacked SRAM, where the second floor is positioned above the first floor. A more detailed description thereof will be described with reference to FIGS. 4A and 4B.

Figure 4A:
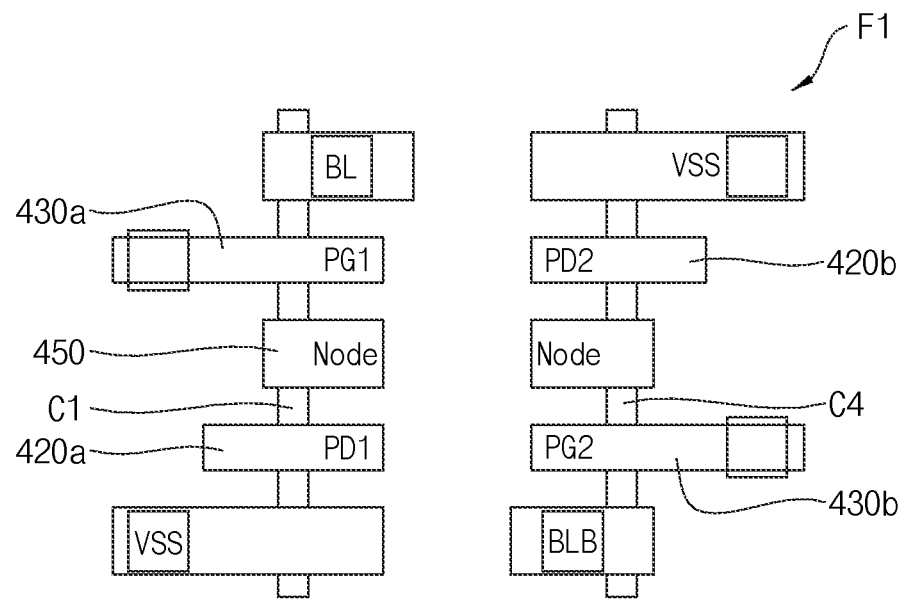
FIG. 4A is a diagram illustrating a top view of a first floor of the 3D stacked SRAM shown in FIG. 3.

FIG. 4A is a diagram illustrating a top view of a first floor of the 3D stacked SRAM shown in FIG. 3.

Referring to FIG. 4A, a first floor F1 of a 3D stacked SRAM may include a first pull-down transistor PD1 420a, a second pull-down transistor PD2 420b, a first pass-gate transistor PG1 430a, a second pass-gate transistor PG2 430b, and nodes 450. As described above with reference to FIG. 3, the PG1 430a and the PD1 420a may be connected through a contact C1, which is connected to one of the nodes 450 (hereinafter referred to as "a first node"). Similarly, the PG2 430b and the PD2 420b may be connected through a contact C4, which is connected to the other one of the nodes 450 (hereinafter referred to as "a second node").

Figure 4B:
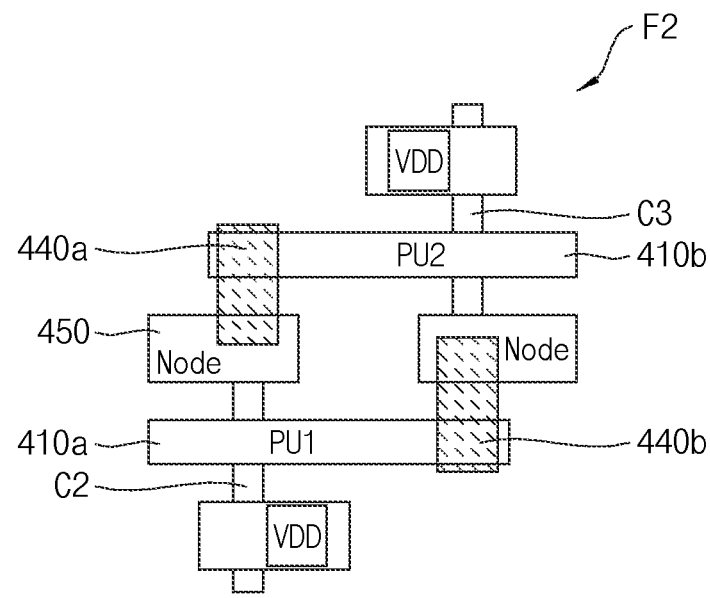
FIG. 4B is a diagram illustrating a top view of a second floor of the 3D stacked SRAM shown in FIG. 3.

FIG. 4B is a diagram illustrating a top view of a second floor of the 3D stacked SRAM shown in FIG. 3.

Referring to FIG. 4B, a second floor F2 of the 3D stacked SRAM may include a first pull-up transistor PU1 410a, a second pull-up transistor PU2 410b, and the nodes 450. The nodes 450 may extend vertically from the first floor F1 to the second floor F2. That is, the nodes 450 may extend in a z-direction (i.e., a direction going into and out of the paper). The first node may connect the contact C1 (shown in FIG. 4A) and a contact C2 so as to form a first inverter including the PU1 410a and the PD1 420a. The second node may connect the contact C4 (shown in FIG. 4A) and a contact C3 so as to form a second inverter including the PU2 410b and the PD2 420b. Accordingly, the nodes 450 (e.g., the first node and the second node) form the first inverter and the second inverter. Moreover, the first node and the second node are respectively connected to the PU2 410b and the PU1 410a on the upper floor through a first cross-couple contact 440a and a second cross-couple contact 440b. Specifically, the first node may be connected to the PU2 410b by the first cross-couple contact 440a and the second node may be connected to the PU1 410a by the second cross-couple contact 440b, thereby connecting the PU1 410a and the PU2 410b disposed on the upper floor to the PD1 420a and the PD2 420b disposed on the lower floor, respectively, and forming a cross-coupled inverter to be used as a memory cell of the SRAM.

However, the SRAM circuit shown in FIGS. 3, 4A and 4B is simply divided into the upper floor and the lower floor and may require more than one gate cutting operation during the manufacture of the SRAM to separate the gates of each transistor. A gate cutting may include, for example, depositing dielectric material to insulate gates of transistors. A dielectric material may include, for example, silicon oxide, silicon nitride, carbon nitride, aluminum nitride, etc. However, the dielectric material is not limited thereto, and may include any other material that is capable of insulating a gate of a transistor from another conductor.

Figure 5A:
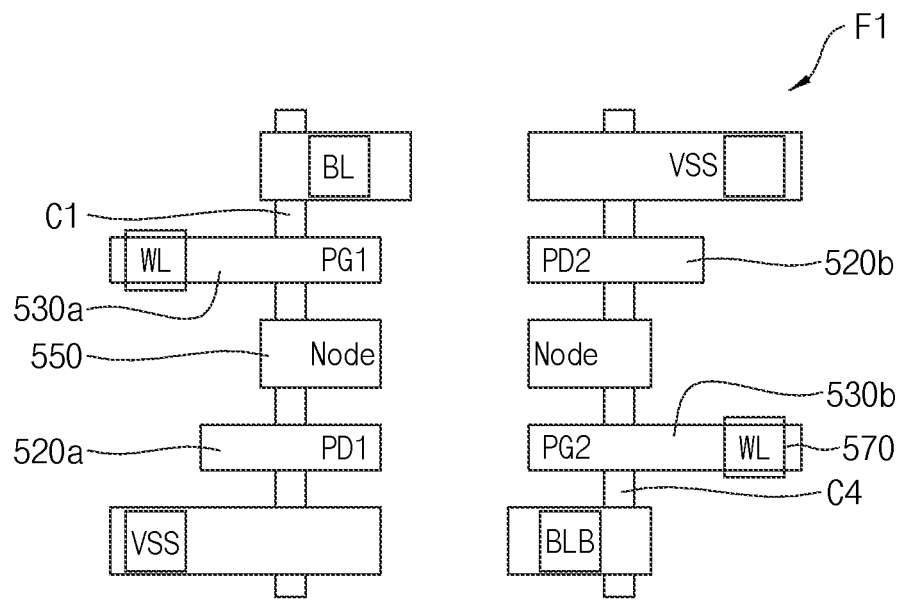
FIG. 5A is a diagram illustrating a top view of a first floor of a 3D stacked SRAM according to an embodiment.

FIG. 5A is a diagram illustrating a top view of a first floor of a 3D stacked SRAM according to an embodiment. Here, the first floor of the 3D stacked SRAM structure according to this embodiment is similar to the 3D stacked SRAM structure shown in FIG. 4A. Therefore, for the brevity of description, description of the same or similar elements provided above may be omitted.

Referring to FIG. 5A, a first floor F1 of a 3D stacked SRAM may include a first pull-down transistor PD1 520a, a second pull-down transistor PD2 520b, a first pass-gate transistor PG1 530a, a second pass-gate transistor PG2 530b, and nodes 550. As described above with reference to FIG. 4A, the PG1 530a and the PD1 520a may be connected through a contact C1, which is connected to one of the nodes 550 (referred to as "a first node"). Similarly, the PG2 530b and the PD2 520b may be connected through a contact C4, which is connected to the other one of the nodes 550 (referred to as "a second node"). Also, each gate of the PG1 530a and the PG2 530b may be connected to the word line WL. Each drain of the PG1 530a and the PG2 530b may be connected to respective bit lines. For example, a drain of the PG1 530a may be connected to a bit line BL and a drain of the PG2 530b may be connected to a complementary bit line BLB. Here, the PD1 520a and the PD2 520b, and the PG1 530a and the PG2 530b may be NMOS transistors.

Figure 5B:
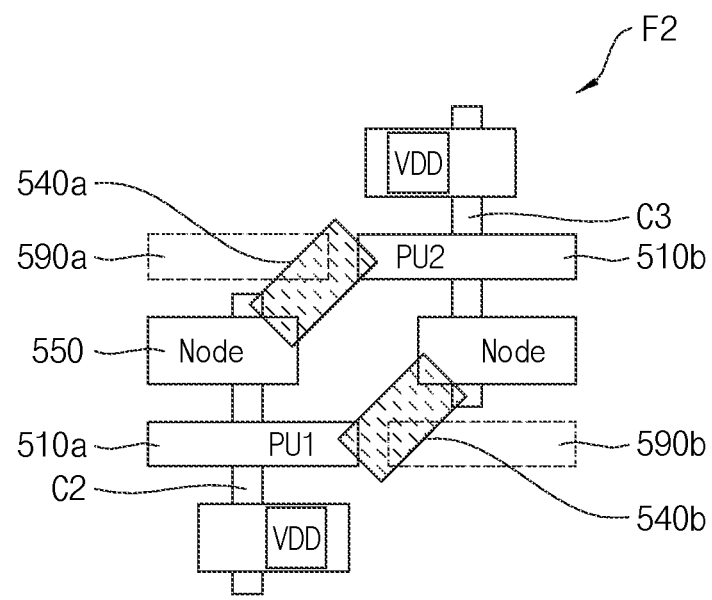
FIG. 5B is a diagram illustrating a top view of a second floor of a 3D stacked SRAM according to an embodiment.

FIG. 5B is a diagram illustrating a top view of a second floor of a 3D stacked SRAM according to an embodiment.

Referring to FIG. 5B, a second floor F2 of the 3D stacked SRAM may include a first pull-up transistor PU1 510a, a second pull-up transistor PU2 510b, a first dummy gate 590a, a second dummy gate 590b and nodes 550. The nodes 550 may extend vertically from the first floor F1 to the second floor F2. That is, the nodes 550 may extend in a z-direction (i.e., a direction going into and out of the paper). The first node may connect the contact C1 (shown in FIG. 5A) and the contact C2 so as to form a first inverter including the PU1 510a and the PD1 520a. The second node may connect the contact C4 (shown in FIG. 4A) and the contact C3 so as to form a second inverter including the PU2 510b and PD2 520b. Accordingly, the nodes 550 (i.e., the first node and the second node) form the first inverter and the second inverter. Moreover, the first node and the second node are respectively connected to the PU2 510b and the PU1 510a on the upper floor through a first cross-couple contact 540a and a second cross-couple contact 540b. Specifically, the first node may be connected to the gate of the PU2 510b transistor by the first cross-couple contact 540a, and the second node may be connected to the gate of the PU1 510a transistor by the second cross-couple contact 540b, thereby connecting the PU1 510a and the PU2 510b disposed on the upper floor to the PD1 520a and the PD2 520b disposed on the lower floor, and forming a cross-coupled inverter to be used as a memory cell of the SRAM.

However, the first cross-couple contact 540a and the second cross-couple contact 540b according to an embodiment may be disposed diagonally to connect the PU1 510a and the PU2 510b to the respective nodes 550. Specifically, the first cross-couple contact 540a may be disposed diagonally to connect the PU2 510b to the first node. Similarly, the second cross-couple contact 540b may be disposed diagonally to connect the PU1 510a to the second node. Here, a portion of the first cross-couple contact 540a may be in contact with the first dummy gate 590a and a portion of the second cross-couple contact 540b may be in contact with the second dummy gate 590b. Such a configuration, for example, the first cross-couple contact 540a being in contact with the first dummy gate 590a, may cause a short circuit in the first inverter because the first cross-couple contact 540a may connect the PU2 510b, the first dummy gate 590a, and the first node which is connected to the PD1 520a and the PG1 530a on the lower floor. Similarly, the second cross-couple contact 540b being in contact with the second dummy gate 590b may cause the same problem as described above. As such, the first inverter and the second inverter may malfunction, making the memory cell of the SRAM inoperable. Therefore, it is necessary to separate the first dummy gate 590a and the second dummy gate 590b from the first cross-couple contact 540a and the second cross-couple contact 540b, respectively. A more detailed description of a manufacturing process of separating the dummy gates from the cross-couple contacts will be described below with reference to FIGS. 6A through 6C.

Figure 6A:
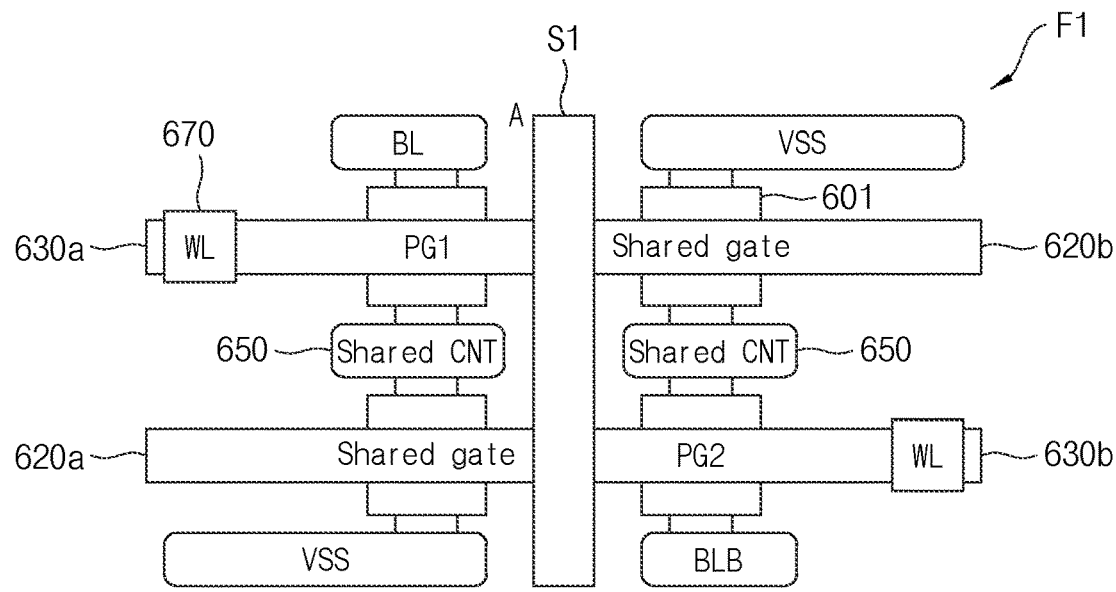
FIG. 6A is a diagram illustrating a top view of a first floor of a 3D stacked SRAM according to an embodiment.

FIG. 6A is a diagram illustrating a top view of a first floor of a 3D stacked SRAM according to an embodiment.

Referring to FIG. 6A, on the first floor F1 (i.e., the lower floor), the 3D stacked SRAM circuit may include an active region 601, a first pull-down transistor PD1 620a, a second pull-down transistor PD2 620b, a first pass-gate transistor PG1 630a, a second pass-gate transistor PG2 630b, shared contacts (CNT) 650, and a word line 670. In FIG. 6A, the shared gates are respective gates of the PD1 620a and the PD2 620b. Therefore, the shared gates in FIG. 6A will be referred to as a "first shared gate 620a" and a "second shared gate 620b" hereinafter. Also, the shared CNT 650 may correspond to the nodes 350, 450 and/or 550 as described above with respect to FIGS. 3 to 5, and the active region 601 may correspond to the contacts C1 to C4 described above with respect to FIGS. 3 to 5.

On the first floor F1, the active region 601 may be connected to each of the PG1 630a, the PG2 630b, the first shared gate 620a and the second shared gate 620b. The shared CNT 650 may be disposed between the PG1 and the first shared gate 620a, and between the second shared gate 620b and the PG2 630b. The word lines 670 may be connected to gates of the PG1 630a and the PG2 630b. Here, a gate cutting S1 may be performed such that the gate of the PG1 630a and the second shared gate 620b are separated. Similarly, the gate cutting S1 may separate the gate of the PG2 630b and the first shared gate 620a. The gate cutting S1 will be described in more detail below with reference to FIGS. 6B and 6C.

Figure 6B:
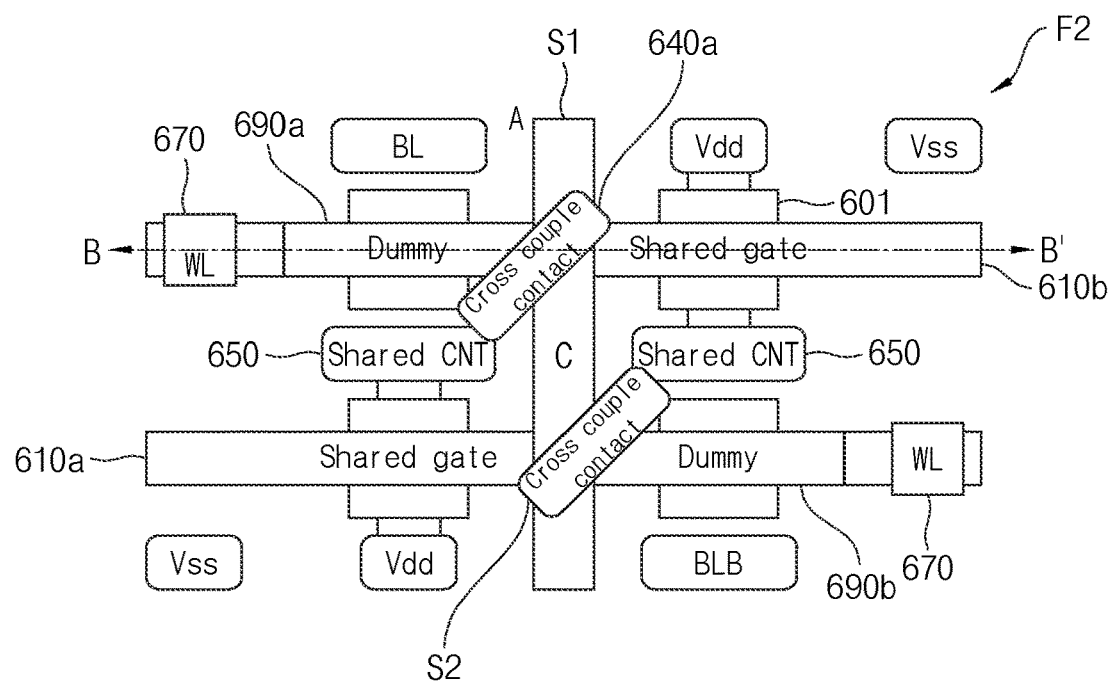
FIG. 6B is a diagram illustrating a top view of a second floor of a 3D stacked SRAM according to an embodiment.

FIG. 6B is a diagram illustrating a top view of a second floor of a 3D stacked SRAM according to an embodiment.

Referring to FIG. 6B, on the second floor F2 (i.e., the upper floor), the 3D stacked SRAM circuit may include a first pull-up transistor PU1 610a, a second pull-up transistor PU2 610b, a first dummy gate 690a, a second dummy gate 690b and the shared CNT 650. The shared CNT may extend vertically from the first floor F1 to the second floor F2. The shared gates in FIG. 6B may represent a gate of the PU1 610a and a gate of the PU2 610b. The shared gates in FIG. 6B will be referred to as a "third shared gate 610a" and a "fourth shared gate 610b." Also, the third shared gate 610a and the fourth shared gate 610b may be used interchangeably with the PU1 610a and the PU2 610b.

Figure 6C:
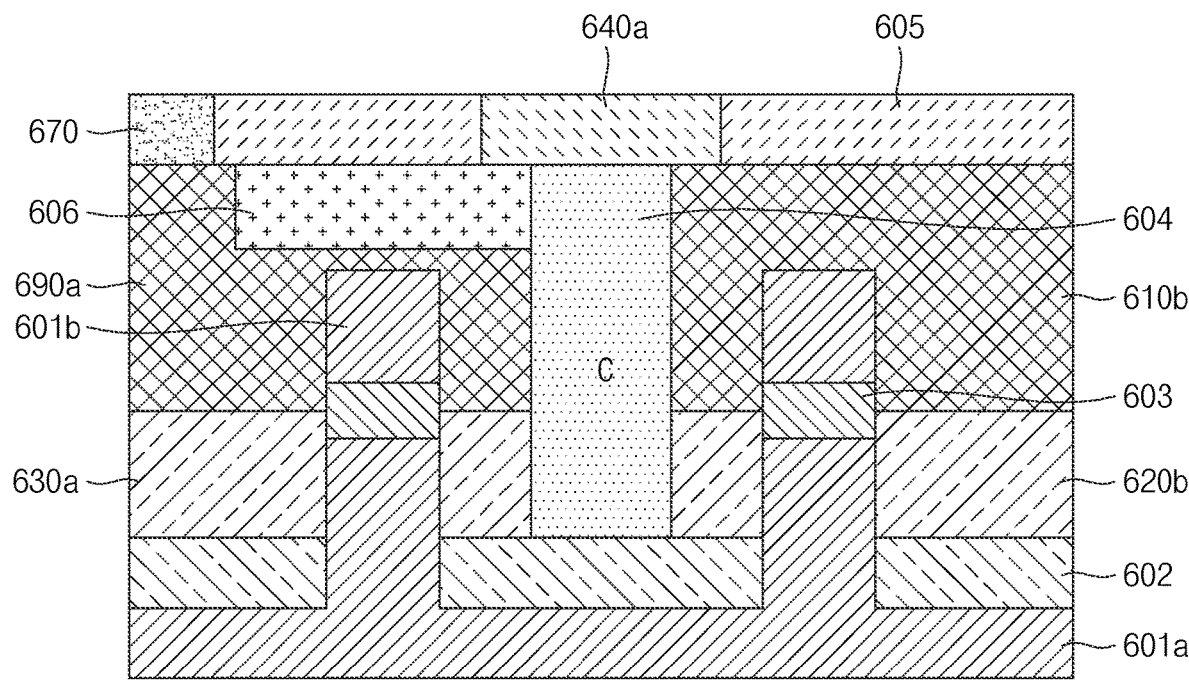
FIG. 6C is a diagram illustrating a cross-sectional view of a 3D stacked SRAM taken along the line B-B' in FIG. 6B, according to an embodiment.

The active region 601 may be connected to the first dummy gate 690a, the second dummy gate 690b, the third shared gate 610a and the fourth shared gate 610b. The active region 601 in FIG. 6B may refer to an active region 601b shown in FIG. 6C, which is disposed above an active region 601a. As shown in FIG. 6C, the active regions 601a and 601b are separated or by a dielectric material such that the active region 601a connected to the first shared gate 620a and the second shared gate 620b is separated from the active region 601b connected to the third shared gate 610a and the fourth shared gate 610b.

The shared CNT 650 may connect the active regions 601 so as to form a first inverter including the PU1 610a and the PD1 620a. The shared CNT 650 may also connect the active regions 601 so as to form a second inverter including the PU2 610b and the PD2 620b. Accordingly, the shared CNT 650 (e.g., corresponding to the first node and the second node in FIGS. 3 to 5) form the first inverter and the second inverter.

The shared CNTs 650 are respectively connected to the fourth shared gate 610b and the third shared gate 610a on the upper floor through a first cross-couple contact 640a and a second cross-couple contact 640b. Specifically, the third shared gate 610a may be connected to one of the shared CNTs 650 by the first cross-couple contact 640a, and the fourth shared gate 610b may be connected to another one of the shared CNTs 650 by the second cross-couple contact 640b, thereby connecting the PU1 610a and the PU2 610b disposed on the upper floor to the PD1 620a and the PD2 620b disposed on the lower floor, respectively, and forming a cross-coupled inverter to be used as a memory cell of the SRAM.

The first cross-couple contact 640a and the second cross-couple contact 640b according to an embodiment may be disposed diagonally to connect the third shared gate 610a and the fourth shared gate 610b to the respective shared CNTs 650. In other words, the first cross-couple contact 640a may be disposed diagonally to connect the fourth shared gate 610b to one of the shared CNTs 650 (e.g., a shared CNT 650 on the left in FIG. 6B). Similarly, the second cross-couple contact 640b may be disposed diagonally to connect the third shared gate 610a to another one of the CNTs 650 (e.g., a shared CNT 650 on the right in FIG. 6B).

When the first cross-couple contact 640a and the second cross-couple contact 640b are disposed to connect the respective shared gates and the shared CNTs, a portion of the first cross-couple contact 640a may be touching or in contact with the first dummy gate 690a and a portion of the second cross-couple contact 640b may be touching or in contact with the second dummy gate 690b. Such a configuration, for example, the first cross-couple contact 640a being in contact with the first dummy gate 690a, may cause a short circuit in the first inverter because the first cross-couple contact 640a may connect the fourth shared gate 610b, the first dummy gate 690a, and the shared CNT 650 connected to the first shared gate 620a and the PG1 630a on the lower floor. Similarly, the second cross-couple contact 640b being in contact with the second dummy gate 690b may cause the same problem above. As such, the first inverter and the second inverter may malfunction, making the memory cell of the SRAM inoperable. Therefore, one may desire to separate the first dummy gate 690a and the second dummy gate 690b from the first cross-couple contact 640a and the second cross-couple contact 640b, respectively.

In addition, the gate cutting S1 may be performed on the second floor F2 to separate the first dummy gate 690a and the PU2 610b. Also, the same gate cutting S1 may separate the second dummy gate 690b and the PU1 610a. The gate cutting S1 will be described in more detail with reference to FIG. 6C below.

FIG. 6C is a diagram illustrating a cross-sectional view of a 3D stacked SRAM taken along the line B-B' in FIG. 6B, according to an embodiment.

Referring to FIG. 6C, a first active region 601a may be disposed on a silicon substrate. Alternatively, the active region 601a may be formed such that it is combined with the silicon substrate. A first dielectric 602 for separating the silicon substrate from metal gates or isolating the silicon substrate may be disposed on the first active region 601a. A gate of the PD2 620b and a gate of the PG1 630a may be disposed on the first dielectric 602. While not shown in FIG. 6C, it may be well understood that the above inventive concept would similarly apply to a gate of the PD1 620a and a gate of the PG2 630b. While the gate of the PD2 620b and the gate of the PG1 630a are described separately for the purpose of illustration, it may be understood that the gate of the PD2 620b and the gate of the PG1 630a may be formed of the same metal material, such as aluminum (Al), tungsten (W), silver (Ag), tin (Sn), gold (Au), nickel (Ni), lead (Pb), titanium (Ti), or alloys thereof. However, the material of metal gates is not limited thereto, and may include any other material that is capable of conducting electricity. The gate of the PD2 620b and the gate of the PG1 630a may be connected to the first active region 601a.

Furthermore, a gate of the PU2 610b and the first dummy gate 690a may be disposed above the gate of the PD2 620b and the gate of the PG1 630a, respectively. The gate of the PU2 610b and the first dummy gate 690a may be connected to second active regions 601b. Here, the second active regions 601b are separated from the first active regions 601a by a second dielectric 603 that is disposed between the first active region 601a and the second active region 601b.

As described above with respect to FIGS. 6A and 6B, the gate cutting S1 may be performed on the gates of the first floor F1 and the gates of the second floor F2. That is, a single gate cutting S1 may be performed to separate the second shared gate 620b and the gate of the PG1 630a, and separate the fourth shared gate 610b and the first dummy gate 690a. Although not shown in FIG. 6C, the single gate cutting S1 may separate the first shared gate 620a and the gate of the PG2 630b, and separate the third shared gate 610a and the second dummy gate 690b. The gate cutting S1 may be performed by filling a region C with a dielectric material.

The first dummy gate 690a (also the second dummy gate 690b) may be formed by etching a portion of the first dummy gate 690a to form a recess in the first dummy gate 690a, and filling a third dielectric 606 in the recess where the portion of the first dummy gate 690a is removed. As such, the portion of the first dummy gate 690a may be insulated. Thereafter, the first cross-couple contact 640a may be disposed such that the first cross-couple contact 640a is in contact with a portion of the fourth shared gate 610b and the third dielectric 606. Because the third dielectric 606 serves to insulate or separate the first dummy gate 690a from being connected to the fourth shared gate 610b through the first cross-couple contact 640a, the first cross-couple contact 640a may only connect the fourth shared gate 610b with the shared CNT 650 (shown in FIG. 6B) while keeping the first dummy gate 690a intact. Also, it should be understood that the above-described structure and process may similarly apply to the second dummy gate 690b, the second cross-couple contact 640b, the third shared gate 610a, and the shared CNT 650.

Furthermore, a fourth dielectric 605 for capping the metal gates may be disposed on the fourth shared gate 610b and a portion of the first dummy gate 690a. The fourth dielectric 605 may be disposed adjacent to each side surface of the first cross-couple contact 640a. In addition, the word line 670 may be disposed on top of a portion of the first dummy gate 690a where the first dummy gate 690 is not isolated by the third dielectric 606. It should be understood that the above-described structure and process may similarly apply to the second dummy gate 690b, the second cross-couple contact 640b, the third shared gate 610a, and the shared CNT 650.

By performing only a single gate cutting to cut the gates disposed on the first floor F1 and the second floor F2, the complexity of manufacturing the 3D stacked SRAM may be significantly reduced. Also, because it is difficult to perfectly or cleanly etch the dummy gates 690 in order to connect only the shared gates 610 and the shared CNT 650 using the cross-couple contacts 640, by placing the third dielectric 606 in the recess formed in the dummy gates 690, the cross-couple contacts 640 may be disposed without touching the dummy gates 690.

Figure 7:
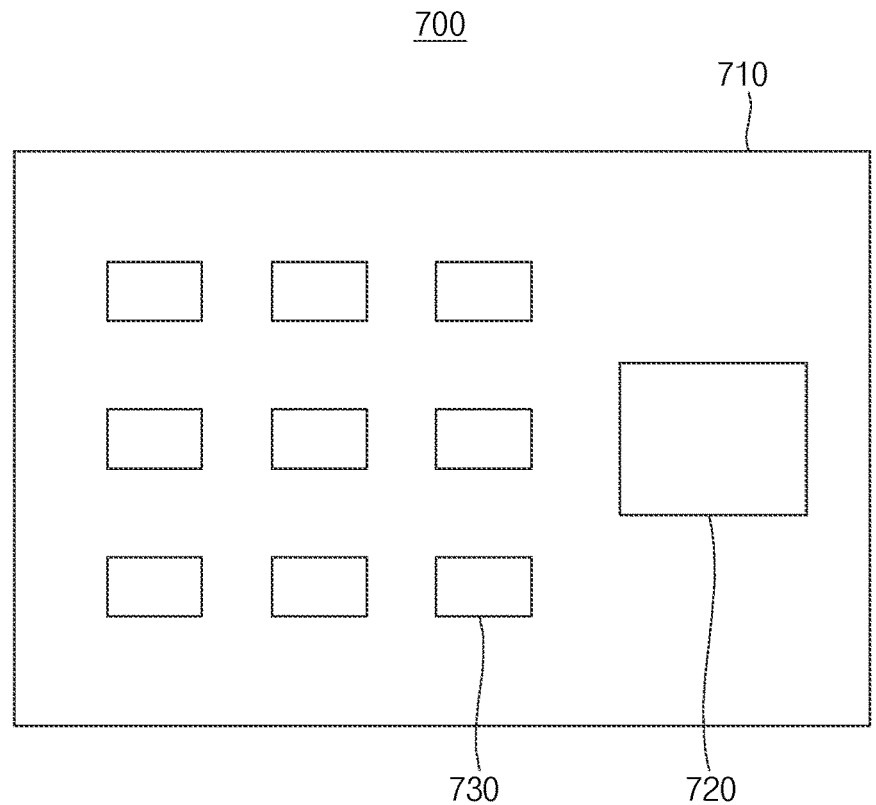
FIG. 7 is a diagram illustrating a schematic plan view of a semiconductor module according to an embodiment.

FIG. 7 is a diagram illustrating a schematic plan view of a semiconductor module according to an embodiment.

Referring to FIG. 7, a semiconductor module 700 according to an embodiment may include a processor 720 and semiconductor devices 730 that are mounted on a module substrate 710. The processor 720 and/or the semiconductor devices 730 may include one or more 3D stacked SRAM described in the one or more embodiments.

Figure 8:
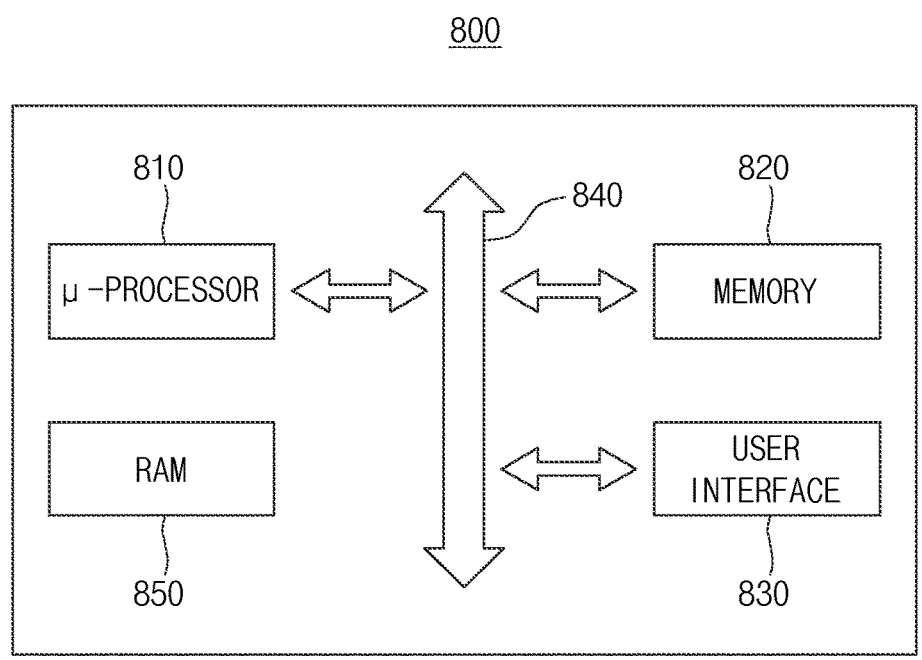
FIG. 8 is a schematic block diagram of an electronic system according to an embodiment.

FIG. 8 is a schematic block diagram of an electronic system according to an embodiment.

Referring to FIG. 8, an electronic system 800 in accordance with an embodiment may include a microprocessor 810, a memory 820, and a user interface 830 that perform data communication using a bus 840. The microprocessor 810 may include a central processing unit (CPU) or an application processor (AP). The electronic system 800 may further include a random access memory (RAM) 850 in direct communication with the microprocessor 810. The microprocessor 810 and/or the RAM 850 may be implemented in a single module or package. The user interface 830 may be used to input data to the electronic system 800, or output data from the electronic system 800. For example, the user interface 830 may include a keyboard, a touch pad, a touch screen, a mouse, a scanner, a voice detector, a liquid crystal display (LCD), a micro light-emitting device (LED), an organic light-emitting diode (OLED) device, an active-matrix light-emitting diode (AMOLED) device, a printer, a lighting, or various other input/output devices without limitation. The memory 820 may store operational codes of the microprocessor 810, data processed by the microprocessor 810, or data received from an external device. The memory 820 may include a memory controller, a hard disk, or a solid state drive (SSD).

At least the microprocessor 810, the memory 820 and/or the RAM 850 in the electronic system 800 may include one or more 3D stacked SRAM described in the one or more embodiments.

Figure 9:
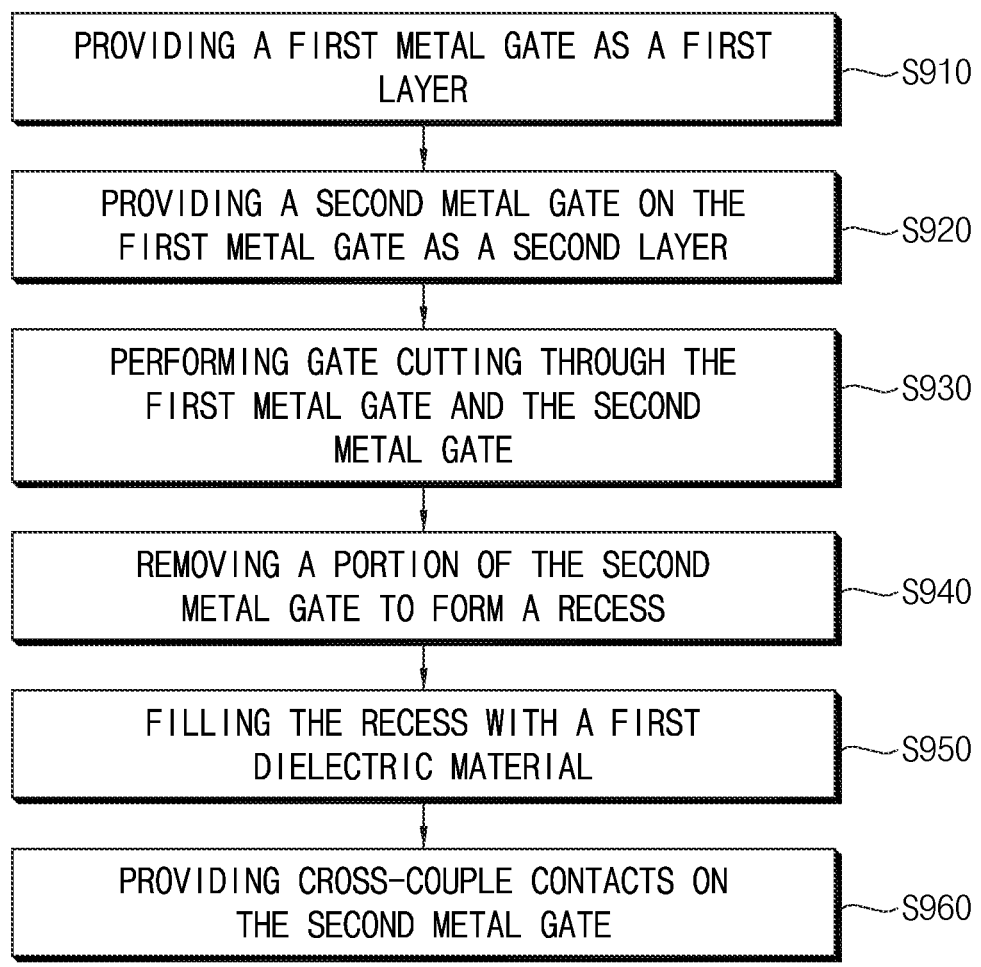
FIG. 9 is a flowchart illustrating a method of manufacturing an SRAM in a three-dimensional (3D) stack according to an embodiment.

FIG. 9 is a flowchart illustrating a method of manufacturing an SRAM in a three-dimensional (3D) stack according to an embodiment.

In operation S910, a first metal gate may be provided as a first layer on a substrate. Here, the first metal gate may be a metal gate prior to being processed into, for example, the PD2 620b and the PG1 630a as shown in FIG. 6C. In addition, the first dielectric 602 may be disposed between the substrate 601 and the first metal gate, and the first metal gate may be disposed on the first dielectric 602.

In operation S920, a second metal gate may be provided on the first metal gate as a second layer. Here, the second metal gate may be a metal gate prior to being processed into, for example, the PU2 610b and the first dummy gate 690a. The second metal gate may the same or different material from the first metal gate.

In operation S930, a gate cutting may be performed on the first metal gate and the second metal gate so as to separate or insulate the PD2 620b and the PG1 630a in the first layer, and separate or insulate the PU2 610b and the first dummy gate 690a in the second layer. Here, a single gate cut may be performed to cut both the first metal gate and the second metal gate.

In operation S940, a portion of the second metal gate may be removed to form a recess on the second metal gate. For example, an upper-side portion of the second metal gate that is adjacent to a gate cutting dielectric C (shown in FIG. 6C) may be removed or etched to form a recess on the second metal gate.

In operation S950, the recess may be filled with a dielectric material.

In operation S960, a cross-couple contact may be provided on the second metal gate. For example, referring back to FIG. 6C, the first cross-couple contact 640a may be diagonally provided on the fourth shared gate 610b so as to connect the fourth shared gate 610b with the shared CNT 650. Here, the cross-couple contact 640a may partially touch or encroach into a surface area above the first dummy gate 690a. However, because the first dummy gate 690a is insulated by the dielectric material (e.g., the third dielectric material 606) filled into the recess of the second metal gate (e.g., the first dummy gate 690a), the first cross-couple contact 640a may not be electrically connected to the first dummy gate 690a.

However, the method of manufacturing an SRAM in a three-dimensional (3D) stack is not limited to the above embodiment, and may include various other methods.

Some of the embodiments of the disclosure have been shown and described above. However, the one or more embodiments of the disclosure are not limited to the aforementioned specific embodiments. It may be understood that various modifications, substitutions, improvements and equivalents thereof can be made without departing from the spirt and scope of the disclosure. It should be understood that such modifications, substitutions, improvements and equivalents thereof shall fall within the protection scope of the disclosure, and should not to be construed independent from the inventive concept or prospect of the disclosure.

What is claimed is:

1. A semiconductor device comprising:
   a static random access memory (SRAM) in a three-dimensional (3D) stack including a plurality of transistors disposed in a first layer and a second layer;
   the first layer including a first shared gate of a first transistor and a second shared gate of a second transistor, among the plurality of transistors;
   the second layer disposed above the first layer and including a third shared gate of a third transistor and a fourth shared gate of a fourth transistor, among the plurality of transistors, wherein the third shared gate is disposed above the first shared gate, and the fourth shared gate is disposed above the second shared gate;
   a first shared contact and a second shared contact;
   a first cross-couple contact connecting the fourth shared gate and the first shared contact; and
   a second cross-couple contact connecting the third shared gate and the second shared contact.

2. The semiconductor device of claim 1, wherein the first transistor and the second transistor are pull-down transistors, and
   wherein the third transistor and the fourth transistor are pull-up transistors.

3. The semiconductor device of claim 1, wherein the first cross-couple contact is disposed diagonally with respect to the fourth shared gate and the first shared contact, and
wherein the second cross-couple contact is disposed diagonally with respect to the third shared gate and the second shared contact.

4. The semiconductor device of claim 1, wherein the first layer further comprises:
a fifth transistor connected to the second shared gate of the second transistor; and
a sixth transistor connected to the first shared gate of the first transistor.

5. The semiconductor device of claim 4, wherein a gate of the fifth transistor and a gate of the sixth transistor are connected to a word line WL.

6. The semiconductor device of claim 4, wherein the second layer further comprises a first dummy gate and a second dummy gate,
wherein the first dummy gate is disposed above a gate of the fifth transistor and the second dummy gate is disposed above a gate of the sixth transistor.

7. The semiconductor device of claim 6, wherein a portion of the first dummy gate and a portion of the second dummy gate include a first dielectric material.

8. The semiconductor device of claim 7, wherein the first cross-couple contact is disposed above the first dielectric material of the first dummy gate and the fourth shared gate so as to electrically connect only the fourth shared gate and the first shared contact, and
wherein the second cross-couple contact is disposed above the first dielectric material of the second dummy gate and the third shared gate so as to electrically connect only the third shared gate and the second shared contact.

9. The semiconductor device of claim 4, wherein the fifth transistor and the sixth transistor are pass-gate transistors.

10. The semiconductor device of claim 1, further comprising:
a first active region connected to the first shared gate and the second shared gate, and
a second active region connected to the third shared gate and the fourth shared gate,
wherein the first active region and the second active region are separated by a second dielectric material disposed between the first active region and the second active region.

11. The semiconductor device of claim 4, wherein a third dielectric material is disposed between a gate of the fifth transistor and the second shared gate, and disposed between a gate of the sixth transistor and the first shared gate.

12. The semiconductor device of claim 6, wherein a third dielectric material is disposed between the first dummy gate and the fourth shared gate, and disposed between the second dummy gate and the third shared gate.

13. The semiconductor device of claim 6, wherein the first shared contact is disposed between the first dummy gate and the third shared gate in the second layer, and
wherein the second shared contact is disposed between the second dummy gate and the fourth shared gate in the second layer.

14. The semiconductor device of claim 4, wherein the first shared contact is disposed between a source of the fifth transistor and the second shared gate of the second transistor in the first layer, and
wherein the second shared contact is disposed between a source of the sixth transistor and the first shared gate of the first transistor in the first layer.

15. The semiconductor device of claim 4, wherein the fifth transistor is connected to a bit line BL and the sixth transistor is connected to a complementary bit line BLB.

16. The semiconductor device of claim 8, wherein a fourth dielectric material is disposed on the fourth shared gate, a third dielectric material, and a portion of the first dummy gate, and
wherein the fourth dielectric material is disposed on the third shared gate, the third dielectric material, and a portion of the second dummy gate.

17. A method of manufacturing a static random access memory (SRAM) in a three-dimensional (3D) stack, the method comprising:
providing a first metal gate as a first layer;
providing a second metal gate as a second layer, the second layer being disposed above the first layer;
performing a gate cutting through the first metal gate and the second metal gate;
removing a portion of the second metal gate to form a first recess;
filling the first recess with a first dielectric material; and
providing a cross-couple contact on the second metal gate and a portion of the first dielectric material.

18. The method of claim 17, wherein the performing the gate cutting through the first metal gate and the second metal gate comprises:
removing a portion of the first metal gate and the second metal gate to form a second recess through the first metal gate and the second metal gate; and
filling the second recess with a second dielectric material.

19. The method of claim 17, wherein the method further comprises:
providing a substrate layer that is disposed below the first layer, wherein the substrate layer includes a first active region connected to the first metal gate and a second active region connected to the second metal gate, and
wherein the first active region and the second active region are separated by a third dielectric material.

20. The method of claim 17, further comprising:
providing a fourth dielectric material on the second metal gate and the first dielectric material.

* * * * *